United States Patent
Akiyama et al.

(10) Patent No.: US 10,727,396 B2
(45) Date of Patent: Jul. 28, 2020

(54) METHOD FOR PRODUCING COMPOSITE WAFER HAVING OXIDE SINGLE-CRYSTAL FILM

(71) Applicant: SHIN-ETSU CHEMICAL CO., LTD., Tokyo (JP)

(72) Inventors: Shoji Akiyama, Annaka (JP); Makoto Kawai, Annaka (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 233 days.

(21) Appl. No.: 15/577,615

(22) PCT Filed: Jun. 1, 2016

(86) PCT No.: PCT/JP2016/066284
§ 371 (c)(1),
(2) Date: Nov. 28, 2017

(87) PCT Pub. No.: WO2016/194978
PCT Pub. Date: Dec. 8, 2016

(65) Prior Publication Data
US 2018/0138395 A1 May 17, 2018

(30) Foreign Application Priority Data
Jun. 2, 2015 (JP) .................... 2015-112334

(51) Int. Cl.
*H01L 21/312* (2006.01)
*H01L 41/312* (2013.01)
(Continued)

(52) U.S. Cl.
CPC .......... *H01L 41/312* (2013.01); *H01L 21/02* (2013.01); *H01L 21/02403* (2013.01);
(Continued)

(58) Field of Classification Search
CPC . H01L 41/312; H01L 21/02; H01L 21/76254; H01L 41/1873; H01L 41/335;
(Continued)

(56) References Cited

U.S. PATENT DOCUMENTS

| | | | |
|---|---|---|---|
| 4,371,419 A | 2/1983 | Fukuda et al. | |
| 5,374,564 A | 12/1994 | Bruel | |

(Continued)

FOREIGN PATENT DOCUMENTS

| | | | |
|---|---|---|---|
| EP | 1 401 022 A1 | 3/2004 | |
| EP | 1 986 218 A1 | 10/2008 | |

(Continued)

OTHER PUBLICATIONS

Dec. 20, 2018 Extended European Search Report issued in European Patent Application No. 16803409.8.

(Continued)

*Primary Examiner* — Jonathan C Langman
(74) *Attorney, Agent, or Firm* — Oliff PLC

(57) ABSTRACT

Provided is a composite wafer (c-wafer) having an oxide single-crystal film transferred onto a support wafer (s-wafer), the film being a lithium tantalate or lithium niobate film, and c-wafer being unlikely to have cracking or peeling caused in the lamination interface between the film and s-wafer. More specifically, provided is a method of producing c-wafer, including steps of: implanting hydrogen atom ions or molecule ions from a surface of the oxide wafer (o-wafer) to form an ion-implanted layer inside thereof; subjecting at least one of the surface of o-wafer and a surface of s-wafer to surface activation; bonding the surfaces together to obtain a laminate; providing at least one of the surfaces of the laminate with a protection wafer having thermal expansion coefficient smaller than that of o-wafer; and heat-treating the laminate with the protection wafer at (Continued)

80° C. or higher to split the laminate along the layer to obtain c-wafer.

8 Claims, 2 Drawing Sheets

(51) Int. Cl.
| | |
|---|---|
| *H01L 21/02* | (2006.01) |
| *H01L 21/18* | (2006.01) |
| *H01L 21/324* | (2006.01) |
| *H01L 21/265* | (2006.01) |
| *H01L 21/762* | (2006.01) |
| *H01L 41/187* | (2006.01) |
| *H01L 41/335* | (2013.01) |

(52) U.S. Cl.
CPC .. *H01L 21/02598* (2013.01); *H01L 21/02694* (2013.01); *H01L 21/187* (2013.01); *H01L 21/265* (2013.01); *H01L 21/324* (2013.01); *H01L 21/76254* (2013.01); *H01L 41/1873* (2013.01); *H01L 41/335* (2013.01)

(58) Field of Classification Search
CPC ......... H01L 21/02403; H01L 21/02598; H01L 21/02694; H01L 21/187; H01L 21/265; H01L 21/324
See application file for complete search history.

(56) References Cited

U.S. PATENT DOCUMENTS

| | | | |
|---|---|---|---|
| 5,526,448 A | 6/1996 | Nagata et al. | |
| 5,668,057 A | 9/1997 | Eda et al. | |
| 5,910,699 A | 6/1999 | Namba et al. | |
| 6,319,430 B1 | 11/2001 | Bordui et al. | |
| 6,348,094 B1 | 2/2002 | Shiono et al. | |
| 6,540,827 B1 | 4/2003 | Levy et al. | |
| 6,803,028 B2 | 10/2004 | Gadkaree et al. | |
| 7,323,050 B2 | 1/2008 | Shiono | |
| 8,748,294 B2 | 6/2014 | Akiyama | |
| 9,837,301 B2 | 12/2017 | Konishi et al. | |
| 10,095,057 B2 | 10/2018 | Iwamoto et al. | |
| 2002/0102777 A1 | 8/2002 | Sakaguchi et al. | |
| 2003/0056718 A1 | 3/2003 | Kawahara et al. | |
| 2005/0066879 A1 | 3/2005 | Shiono | |
| 2010/0088868 A1* | 4/2010 | Kando | H01L 41/257 29/25.35 |
| 2010/0107388 A1 | 5/2010 | Iwamoto | |
| 2011/0227068 A1* | 9/2011 | Akiyama | H01L 21/76254 257/43 |
| 2012/0247686 A1 | 10/2012 | Stefanescu | |
| 2012/0280355 A1 | 11/2012 | Akiyama | |
| 2013/0072009 A1* | 3/2013 | Bruel | H01L 21/762 438/530 |
| 2015/0200129 A1 | 7/2015 | Konishi et al. | |
| 2016/0056068 A1 | 2/2016 | Hu et al. | |

FOREIGN PATENT DOCUMENTS

| | | |
|---|---|---|
| JP | 3048201 B2 | 6/2000 |
| JP | 2002-231912 A | 8/2002 |
| JP | 2003-095798 A | 4/2003 |
| JP | 2010-109949 A | 5/2010 |
| JP | 2010-161359 A | 7/2010 |
| JP | 2011-138932 A | 7/2011 |
| JP | 2013-149853 A | 8/2013 |
| JP | 2015-046486 A | 3/2015 |
| WO | 2014/017369 A1 | 1/2014 |
| WO | 2014/153923 A1 | 10/2014 |

OTHER PUBLICATIONS

Dec. 20, 2018 Extended European Search Report issued in European Patent Application No. 16803411.4.
Dec. 20, 2018 Extended European Search Report issued in European Patent Application No. 16803412.2.
Nov. 9, 2018 Extended European Search Report issued in European Patent Application No. 16803410.6.
Henttinen, K., et al. "Mechanically Induced Si Layer Transfer in Hydrogen-Implanted Si Wafers". Applied Physics Letters, vol. 76, No. 17, pp. 2370-2372, (2000).
Jul. 19, 2016 Search Report issued in International Patent Application No. PCT/JP2016/066282.
Dec. 5, 2017 International Preliminary Report on Patentability issued in International Patent Application No. PCT/JP2016/066281.
Jul. 19, 2016 Search Report issued in International Patent Application No. PCT/JP2016/066281.
Jul. 19, 2016 Search Report issued in International Patent Application No. PCT/JP2016/066283.
U.S. Appl. No. 15/577,456, filed Nov. 28, 2017 in the name of Akiyama et al.
U.S. Appl. No. 15/577,405, filed Nov. 28, 2017 in the name of Akiyama et al.
U.S. Appl. No. 15/577,683, filed Nov. 28, 2017 in the name of Akiyama et al.
Dec. 5, 2017 International Preliminary Report on Patentability issued in International Patent Application No. PCT/JP2016/066282.
Dec. 5, 2017 International Preliminary Report on Patentability issued in International Patent Application No. PCT/JP2016/066283.
Jul. 19, 2016 International Search Report issued in Patent Application No. PCT/JP20161066284.
Dec. 5, 2017 International Preliminary Report on Patentability issued in Patent Application No. PCT/JP2016/066284.
Taiyo Yuden Co., Ltd., "Temperature Compensation Technology for Saw-Duplexer Used in RF Front End of Smartphone.", Dempa Shimbun High Technology, http://www.yuden.co.jp/jp/product/tech/column/20121108.html, (2012) (2015).
Tauzin, A. et al., "3-Inch Single-Crystal liTaO3 Films Onto Metallic Electrode Using Smart CutTM Technology.", Electronics Letters. vol. 44, No. 13, pp. 822-824, (2008).
Liu, Weill et al., "Fabrication of Single-Crystalline LiTaO3 Film on Silicon Substrate using Thin Film Transfer Technology.", J. Vac. Technol. B26(1), pp. 206-208, (2008).
Oct. 2, 2019 Office Action issued in U.S. Appl. No. 15/577,683.
Oct. 2, 2019 Office Action issued in U.S. Appl. No. 15/577,456.
Oct. 3, 2019 Office Action issued in U.S. Appl. No. 15/577,405.
Apr. 16, 2020 Office Action issued in U.S. Appl. No. 15/577,405.

* cited by examiner

METHOD FOR PRODUCING COMPOSITE WAFER HAVING OXIDE SINGLE-CRYSTAL FILM

TECHNICAL FIELD

The invention relates to a method of producing a composite wafer. More specifically, the invention relates to a method of producing a composite wafer having an oxide single-crystal film on a support wafer.

BACKGROUND ART

In the field of mobile communication devices typified by smartphones, a drastic increase in communication traffic and multi-functionality have recently progressed. In order to meet the increase in communication traffic, the number of bands has been increased, while the mobile communication devices are required to have various functions without enlarging the shape of them. Various parts to be used for these mobile communication devices must therefore be smaller and have higher performance.

An oxide single crystal such as lithium tantalite (LT) and lithium niobate (LN) is a typical piezoelectric material and has been used widely as a material of surface acoustic wave (SAW) devices. The oxide single crystal used as a piezoelectric material enables band broadening because an electromechanical coupling factor, which indicates the conversion efficiency of electromagnetic energy into dynamic energy, is large. However, it has low stability against a temperature change, and the frequency to which it can respond varies with the temperature change. The low stability against the temperature change owes to the thermal expansion coefficient of the oxide single crystal.

For improving the temperature stability in the case where the oxide single crystal is used as a piezoelectric material, there is provided, for example, a method comprising steps of: laminating, with an oxide single-crystal wafer, a material having a thermal expansion coefficient smaller than that of the oxide single crystal, more specifically, a sapphire wafer; and thinning (e.g. grinding) the oxide single-crystal wafer side of the resulting laminate to a thickness of from several to tens of μm to suppress the influence of thermal expansion of the oxide single crystal (Non-Patent Document 1). In this method, however, the oxide single-crystal wafer is ground after lamination, so that a large portion of the oxide single-crystal wafer is wasted. Thus, it is inferior in terms of efficient use of the material. In addition, lithium tantalate or lithium niobate used as the oxide single crystal is an expensive material so that there is a demand for a method involving highly efficient use of the material and being capable of reducing the waste so as to reduce a production cost.

As an example of the method of producing a SOI wafer, the Small-Cut method, in short, comprises steps of: laminating a silicon wafer having a hydrogen ion-implanted layer with a support wafer, and heat-treating the resulting laminate around 500° C. to thermally split the laminate along the ion-implanted layer (Patent Document 1). In order to enhance the efficient use of an oxide single-crystal wafer, an attempt has been made to use the oxide single-crystal wafer instead of the silicon wafer used in the Small-Cut method to form an oxide single-crystal film on the support wafer (Non-Patent Documents 2 and 3).

Non-Patent Document 2 reports a method of producing a LTMOI (lithium-tantalate-metal-on-insulator) structure comprising steps of: forming a 121-nm thick Cr metal layer on a surface of a lithium tantalate wafer having an ion-implanted layer; laminating the wafer with a $SiO_2$ substrate having a thickness of hundreds of nm, while keeping the metal layer therebetween; heat-treating the resulting laminate at a temperature of from 200 to 500° C. to split the laminate along the ion-implanted layer, thereby transferring a lithium tantalate film onto the $SiO_2$ substrate via the metal layer; and laminating the lithium tantalate wafer with the surface of the $SiO_2$ substrate on the side opposite to the surface to which the lithium tantalate film has been transferred. Non-Patent Document 3 reports a method of thermally transferring a lithium tantalate film onto the silicon wafer comprising steps of: laminating a silicon wafer with a lithium tantalate wafer having an ion-implanted layer; and heat-treating the resulting laminate at 200° C. to split the laminate along the ion-implanted layer.

PRIOR ART DOCUMENT

Patent Document

[Patent Document 1] Japanese Patent No. 3048201

Non-Patent Documents

[Non-Patent Document 1] Taiyo Yuden Co., Ltd., "Temperature compensation technology for SAW-Duplexer used in RP front end of smartphone", [online], Nov. 8, 2012, Dempa Shimbun High Technology, [searched on Mar. 20, 2015], internet (URL:http://www.yuden.co.jp/jp/product/tech/column/20121108.html)

[Non-Patent Document 2] A Tauzin et al., "3-inch single-crystal $LiTaO_3$ films onto metallic electrode using Smart Cut™ technology", Electric Letters, 19 Jun. 2008, Vol. 44, No. 13, p. 822

[Non-Patent Document 3] Weill Liu et al., "Fabrication of single-crystalline $LiTaO_3$ film on silicon substrate using thin film transfer technology", J. Vac. Sci. Technol. B26 (1), January/February 2008, p. 206

SUMMARY OF THE INVENTION

Problem to be Solved by the Invention

An oxide single crystal such as lithium tantalate (LT) and lithium niobate (LN) is hard and very fragile. In addition, it has a markedly large thermal expansion coefficient compared with those of silicon, glass and sapphire as shown in FIG. 2. The oxide single crystal therefore has such a drawback that heat-treating at a high temperature after lamination with a different kind of wafer such as a silicon, glass or sapphire wafer may cause peeling or cracking between the wafers thus laminated due to a difference in thermal expansion coefficient. For example, a difference in thermal expansion coefficient between lithium tantalate and sapphire, which is typically used as a support wafer and has a particularly large thermal expansion coefficient, is as large as $7 \times 10^{-6}/K$ (=7 ppm/K) or more, as can be confirmed from FIG. 2.

According to the Non-Patent Document 2, by selecting the structure of interposing the metal layer and the $SiO_2$ substrate between the lithium tantalate wafer and the lithium tantalate film, the lithium tantalate film can be transferred, while suppressing peeling or cracking of the wafer attributable to the difference in thermal expansion during the heat treatment. In this method, however, an underlying substrate is made of lithium tantalite, which is a material also used for the film, so that poor temperature stability, which is the above-described problem of a piezoelectric material, cannot be improved. In addition, the film cannot be transferred unless heat-treated at 200° C. or higher. Further, the structure of interposing the metal layer narrows the range of applications. Still further, expensive lithium tantalate must be used excessively for suppressing cracking of the wafer, leading to an increase in a production cost.

Non-Patent Document 3 describes heat treatment at a temperature of from 200 to 800° C. However, heat treatment only at 200° C. was carried out in an example of transferring the lithium tantalate film onto the silicon wafer by the Smart-Cut method. In this example, there is no description on whether or not the lithium tantalate film was transferred onto the entire surface of the silicon wafer. The present inventors have carried out a verification test on splitting during the heat treatment at 200° C. by using a method similar to that used in Non-Patent Document 3, and found that the lithium tantalate film was transferred onto not the entire surface of the silicon wafer but a small area of the surface. In particular, the lithium tantalate film was not transferred at all at the peripheral area of the silicon wafer. This is presumed to occur because the wafers formed into the laminate were warped due to a difference in thermal expansion during the heat treatment, and peeling occurred along the lamination interface with the lithium tantalate wafer at the peripheral area of the silicon wafer. Even if the heat treatment is done at 200° C. or higher, it is impossible to prevent the warp of the wafers formed into the laminate due to the difference in thermal expansion and to stably transfer the lithium tantalate film onto the entire surface of the silicon wafer, as described above.

Solution to the Problem

The inventors have carried out an extensive investigation and have found a method of producing a low-cost composite wafer, comprising an oxide single-crystal film on the support wafer and being unlikely to peel or crack at the lamination interface, unexpectedly by selecting a support wafer material having a thermal expansion coefficient largely different from that of an oxide single crystal, specifically, by selecting a support wafer material having a thermal expansion coefficient of 7 ppm/K or more smaller than that of an oxide single crystal. This approach is different from the conventional approach of suppressing generation of a stress by using materials having thermal expansion coefficients close to each other. More specifically, regarding a laminate formed by laminating an oxide single-crystal wafer having an ion-implanted layer formed using a predetermined hydrogen ion implantation dose with a support wafer having a thermal expansion coefficient smaller than that of the oxide single crystal, taking advantage of a bonding force between the wafers generated by surface activation treatment or the like, the inventors have unexpectedly found that the ion-implanted layer of the laminate can be embrittled to split the laminate by a simple method of placing a protection wafer on at least one of the surfaces of the laminate.

In an aspect of the invention, there is provided a method of producing a composite wafer having an oxide single-crystal film on a support wafer, comprising steps of:

implanting hydrogen atom ions or hydrogen molecule ions into an oxide single-crystal wafer through a surface thereof, which wafer is a lithium tantalate or lithium niobate wafer, to form an ion-implanted layer inside the oxide single-crystal wafer;

subjecting at least one of the surface of the oxide single-crystal wafer and a surface of a support wafer to be laminated with the oxide single-crystal wafer to surface activation treatment;

after the surface activation treatment, bonding the surface of the oxide single-crystal wafer to the surface of the support wafer to obtain a laminate;

providing at least one of surfaces of the laminate with a protection wafer having a thermal expansion coefficient smaller than that of the oxide single-crystal wafer;

heat-treating the laminate provided with the protection wafer at a temperature of 80° C. or higher to split the laminate along the ion-implanted layer to obtain an oxide single-crystal film transferred onto the support wafer; wherein an implantation dose of the hydrogen atom ions is from $5.0 \times 10^{16}$ atom/cm$^2$ to $2.75 \times 10^{17}$ atom/cm$^2$ and an implantation dose of the hydrogen molecule ions is from $2.5 \times 10^{16}$ atoms/cm$^2$ to $1.37 \times 10^{17}$ atoms/cm$^2$;

the support wafer is selected from the group consisting of a sapphire wafer, a silicon wafer, a silicon wafer with an oxide film, and a glass wafer; and the temperature of 80° C. or higher in the step of thermal-treating is from 80 to 150° C. in a case where the support wafer is the sapphire wafer; from 80 to 125° C. in a case where the support wafer is the silicon wafer or the silicon wafer with an oxide film; and from 80 to 110° C. in a case where the support wafer is the glass wafer.

Effect of the Invention

According to the invention, by using the production method, there can be provided a composite wafer having high adhesion at the lamination interface between the support wafer and the oxide single-crystal film, being unlikely to cause peeling or cracking, and having the oxide single-crystal film with a uniform thickness transferred onto the entire surface of the support wafer. The oxide single-crystal wafer separated through the transfer of the oxide single-crystal film onto the support wafer can be used again for the production of a composite wafer so that use of the production method can bring cost reduction.

MODE FOR CARRYING OUT THE INVENTION

Figure 1:
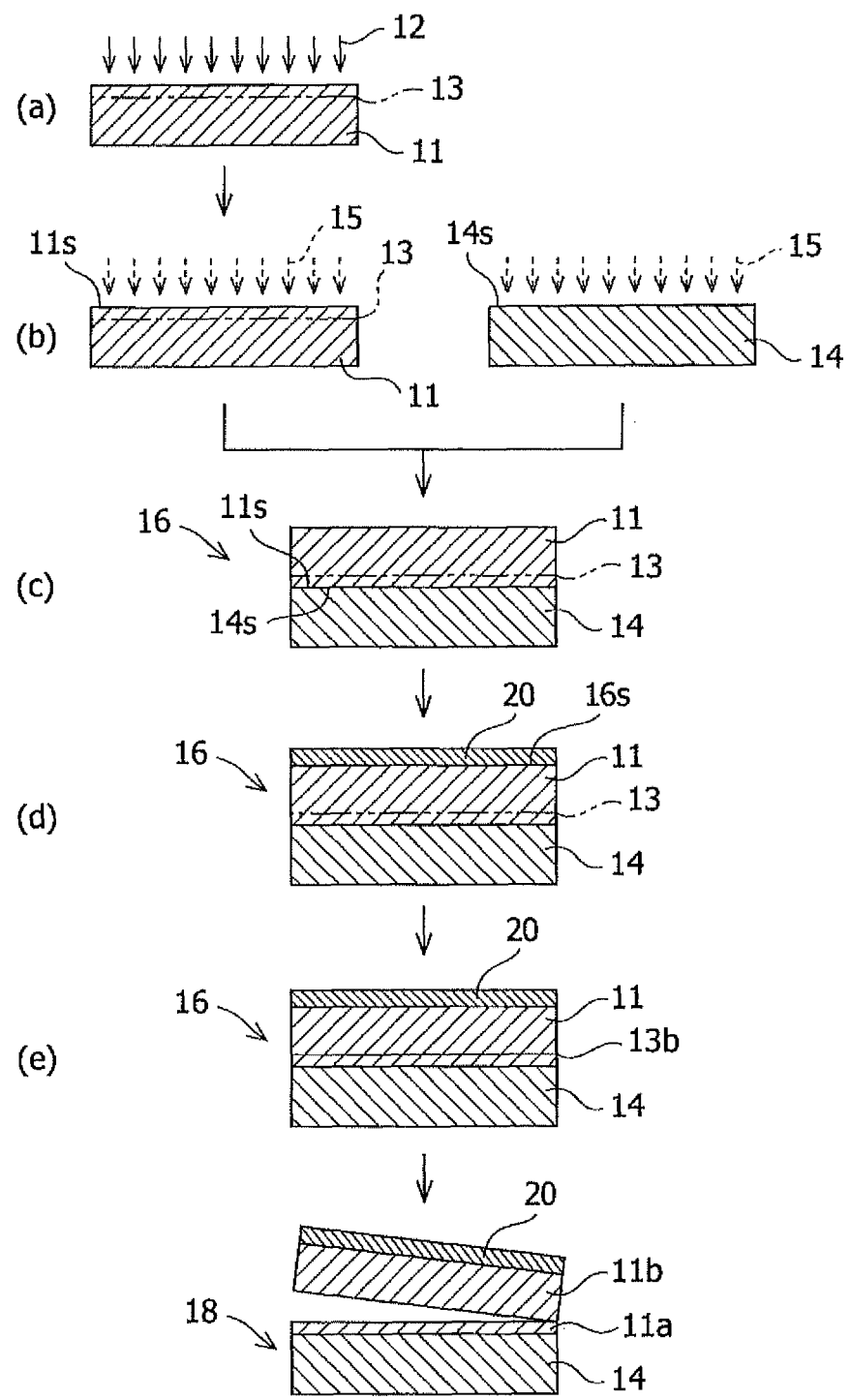
FIG. 1 is a schematic view of the method of producing a composite wafer in one of the embodiments of the invention.
Figure 2:
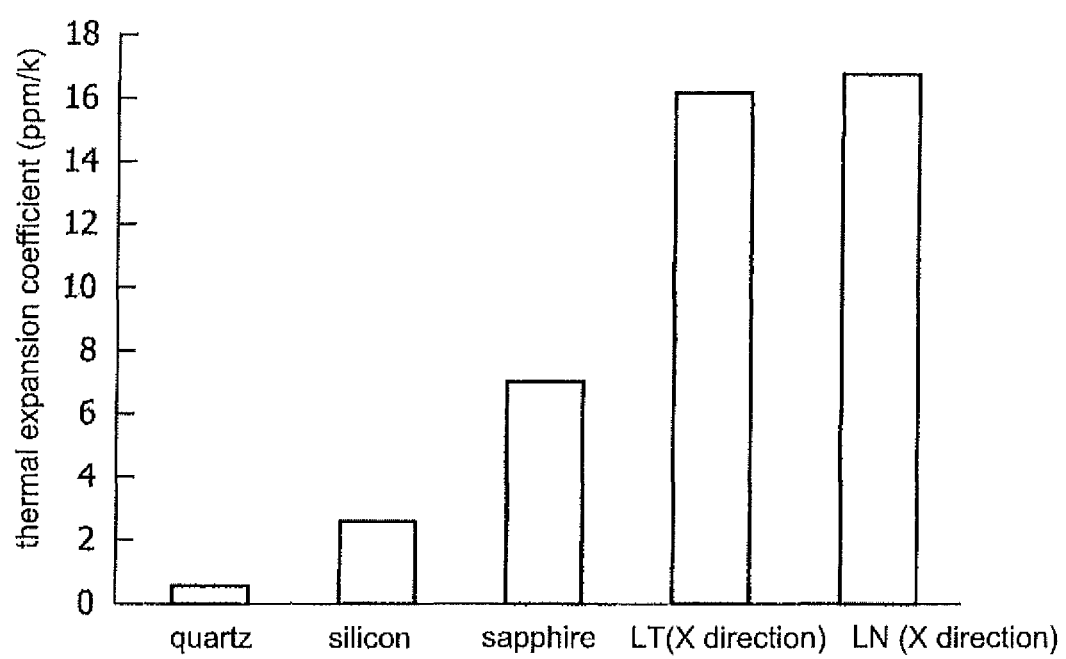
FIG. 2 shows comparison in thermal expansion coefficient among various materials.

Embodiments for carrying out the invention will hereinafter be described in detail, but the scope of the invention is not limited by them.

In one of the embodiments of the invention, there is provided a method of producing a composite wafer having an oxide single-crystal film on a support wafer.

The support wafer may be, for example, a wafer made of a material having a thermal expansion coefficient of at least 7 ppm/K smaller than that of the oxide single-crystal wafer to be laminated. Examples of the support wafer include a sapphire wafer, a silicon wafer, a silicon wafer with an oxide film, and a glass wafer. The size of the support wafer is not particular limited, and may be, for example, a wafer having a diameter of from 75 to 150 mm and a thickness of from 0.2 to 0.8 mm. The support wafer is not particularly limited, and a commercially available wafer may be used. For example, the silicon wafer with an oxide film is a silicon wafer having an oxide film formed at least on the surface to be laminated, wherein the oxide film may be formed on the surface of a silicon wafer by heat-treating the silicon wafer at 700 to 1200° C. in an air atmosphere. The thickness of the oxide film of the silicon wafer with an oxide film is not particularly limited, and is preferably from 10 to 500 nm.

The oxide single crystal is a compound made from lithium, a metal element such as tantalum or niobium, and oxygen. Examples of the oxide single crystal include lithium tantalate ($LiTaO_3$) and lithium niobate ($LiNbO_3$). The oxide single crystal is preferably a lithium tantalate single crystal or a lithium niobate single crystal particularly when it is used for a laser element, a piezoelectric element, a surface acoustic wave element or the like. The oxide single crystal is typically used in the form of a wafer. The size of the oxide single-crystal wafer is not particularly limited, and may have, for example, a diameter of from 75 to 150 mm and a thickness of from 0.2 to 0.8 mm. The oxide single-crystal wafer may be selected from commercially available wafers, or may be produced by using one of known methods (for example, JP 2003-165795A, and JP 2004-079061T which is the national phase publication of PCT application) including the Czochralski process, or may be produced in combination of the steps contained by the known methods.

Each of the support wafer and the oxide single-crystal wafer preferably has a surface roughness RMS of 1.0 nm or less at the surface to be bonded together. The surface roughness RMS of more than 1.0 nm may generate a gap at the lamination interface and the gap may cause peeling. A wafer having a surface roughness RMS of more than 1.0 nm may be subjected to chemical mechanical polishing (CMP) to have the desired surface roughness. The surface roughness RMS may be evaluated, for example, by atomic force microscopy (AFM).

Hydrogen ions are implanted into the oxide single-crystal wafer through a surface thereof to form an ion-implanted layer inside the oxide single-crystal wafer. The ion-implanted layer is formed by implanting a predetermined dose of hydrogen atom ions ($H^+$) or hydrogen molecule ions ($H_2^+$) with an implantation energy enough to form an ion-implanted layer at a desired depth from the surface of the oxide single-crystal wafer. The implantation energy may be, for example, from 50 to 200 keV in this implantation. The implantation dose of hydrogen atom ions ($H^+$) is from $5.0 \times 10^{16}$ atom/$cm^2$ to $2.75 \times 10^{17}$ atom/$cm^2$. The implantation dose of less than $5.0 \times 10^{16}$ atom/$cm^2$ does not cause embrittlement of the ion-implanted layer in a later step. The implantation dose of more than $2.75 \times 10^{17}$ atom/$cm^2$ generates microcavities in the surface from which the ions have been implanted, so that the wafer having a desired surface roughness cannot be obtained because of the unevenness in the wafer surface. The implantation dose of hydrogen molecule ions ($H_2^+$) is from $2.5 \times 10^{16}$ atoms/$cm^2$ to $1.37 \times 10^{17}$ atoms/$cm^2$. The implantation dose of less than $2.5 \times 10^{16}$ atoms/$cm^2$ does not cause embrittlement of the ion-implanted layer in a later step. The implantation dose of more than $1.37 \times 10^{17}$ atoms/$cm^2$ generates microcavities in the surface from which the ions have been implanted, so that the wafer from having a desired surface roughness cannot be obtained because of the unevenness in the wafer surface. The implantation dose of hydrogen atom ions may be twice the dose of hydrogen molecule ions.

Next, at least one of the surface of the oxide single-crystal wafer from which the ions have been implanted and the surface of the support wafer to be laminated with the oxide single-crystal wafer is subjected to surface activation treatment. Both of the surface of the oxide single-crystal wafer from which the ions have been implanted and the surface of the support wafer to be laminated with the oxide single-crystal wafer may be subjected to surface activation treatment. At least one of the surfaces is required to be subjected to surface activation treatment. As a result of the surface activation treatment, the desired degree of a bond strength can be obtained even at relatively low temperature of the heat treatment after the step of bonding (i.e. laminating) without requiring high temperature heat treatment to enhance a bond strength. Particularly when a hard and fragile oxide single-crystal wafer such as a lithium tantalate or lithium niobate wafer and a support wafer having a thermal expansion coefficient of much smaller than that of the oxide single-crystal wafer are laminated together after the surface activation treatment as described above, a large shear stress generated in parallel with the lamination interface due to a difference in thermal expansion coefficient between the oxide single-crystal wafer and the support wafer via a protection wafer at a relatively low temperature in the later step may accelerate fracture not at the lamination interface provided with a bond strength enough to compete with the shear stress by the surface activation treatment but at the ion-implanted layer to the degree of not causing splitting.

Examples of the surface activation treatment include ozone water treatment, UV ozone treatment, ion beam treatment, and plasma treatment. When the ozone water treatment is selected, the surface can be activated with active ozone, for example, by introducing an ozone gas into pure water to obtain ozone water, and immersing the wafer in the resulting ozone water. When UV ozone treatment is selected, the surface can be activated, for example, by retaining the wafer in an atmosphere in which active ozone has been generated by irradiating the air or an oxygen gas with short-wavelength UV light (having, for example, a wavelength of about 195 nm). When ion beam treatment is selected, the surface can be activated, for example, by applying an ion beam such as Ar to the wafer surface in high vacuum (e.g. less than $1 \times 10^{-5}$ Pa) to allow highly active dangling bonds to be exposed on the surface. When plasma treatment is selected, the surface is treated with plasma, for example, by exposing the wafer placed in a vacuum chamber to a plasma gas under reduced pressure (for example, from 0.2 to 1.0 mTorr) for about 5 to 60 seconds. As the plasma gas, an oxygen gas is used for oxidizing the surface, while a hydrogen gas, a nitrogen gas, an argon gas, or a mixture thereof may be used for not oxidizing the surface. When the wafer surface is treated with plasma, organic matters thereon are removed by oxidation and further, the wafer surface is activated because of the increased number of OH groups on the surface.

After the surface activation treatment, the surface of the oxide single-crystal wafer from which the ions have been implanted is bonded to the surface of the support wafer to obtain a laminate. The oxide single-crystal wafer and the support wafer are laminated together preferably at a temperature in the vicinity of room temperature (including the room temperature), for example, from 10 to 50° C. The composite wafer as a product is often used around room temperature so that the temperature at the bonding (i.e. laminating) is desirably based on this temperature range. The temperature at the bonding may be a temperature of the location where the step of bonding takes place, that is, an ambient temperature or an atmospheric temperature in an apparatus. The temperature at the bonding (i.e. laminating)

may be controlled, for example, by selecting the atmospheric temperature in a lamination apparatus. The term "room temperature" means an ambient temperature measured without heating or cooling an object. The room temperature is not particularly limited, and is, for example, from 10 to 30° C., preferably around 25° C.

Next, at least one of the surfaces of the laminate is provided with a protection wafer. A material of the protection wafer is not particularly limited insofar as it has a thermal expansion coefficient smaller than that of the oxide single-crystal wafer, and is preferably a wafer selected from the group consisting of a sapphire wafer, a silicon wafer and a glass wafer. The protection wafer is not particularly limited, and may be a commercially available protection wafer. The protection wafer is preferably provided on a oxide single-crystal wafer-side surface of the laminate, a support wafer-side surface of the laminate, or both of these surfaces, and is more preferably provided on the oxide single-crystal wafer-side surface of the laminate. When the laminate has protection wafers on both the surfaces of the laminate, the protection wafers may be made of the same material or different materials.

The size of the protection wafer is not particularly limited, and is preferably equal to or more than the diameter of the laminate. The protection wafer may be a wafer having, for example, a diameter of from 75 to 150 mm and a thickness of from 0.2 to 1.0 mm. The protection wafer may optionally have such a thickness that a ratio of the thickness of the protection wafer to the thickness of the laminate is in the predetermined range. For example, when a laminate obtained by laminating an oxide single-crystal wafer having a thickness of from 0.2 to 0.6 mm with a support wafer having a thickness of from 0.2 to 0.8 mm is provided with a protection wafer, the protection wafer provided only on the oxide single-crystal wafer-side surface of the laminate preferably has a thickness of from 0.3 to 1.0 mm; the protection wafer provided only on the support wafer-side surface of the laminate preferably has a thickness of from 0.4 to 1.0 mm; and the protection wafer provided on both the surfaces of the laminate preferably has a thickness of from about 0.3 to 0.65 mm. For example, when a laminate having an oxide single-crystal wafer-side thickness of from 0.2 to 0.35 mm and a support wafer-side thickness of from 0.2 to 0.35 mm is provided with a protection wafer, the protection wafer provided only on the oxide single-crystal wafer-side surface of the laminate preferably has a thickness of from 0.35 to 1.0 mm; the protection wafer provided only on the support wafer-side surface of the laminate preferably has a thickness of from 0.35 to 1.0 mm; and the protection wafer provided on both the surfaces of the laminate preferably has a thickness of from about 0.3 to 0.65 mm.

The protection wafer may be fixed on a surface of the laminate through a double sided tape or an adhesive. The protection wafer provided on the laminate makes it difficult to cause cracking at the lamination interface between the support wafer and the oxide single-crystal wafer because it can prevent the laminate from warping in the later step of heat treatment and can also absorb the impact generated during thermal splitting. As a result, a large shear stress generated during heat treatment in a direction parallel to the lamination interface due to a difference in thermal expansion coefficient between the oxide single-crystal wafer and the support wafer concentrates not on the lamination interface but on the ion-implanted layer to accelerate destruction further.

Next, the laminate provided with the protection wafer is heat-treated at a temperature of 80° C. or higher to split the laminate along the ion-implanted layer to obtain an oxide single-crystal film transferred onto the support wafer. When the temperature is lower than 80° C., a bonding strength may become insufficient at the lamination interface between the oxide single-crystal wafer and the support wafer, so that peeling may be caused at the lamination interface. The heat treatment temperature may be changed depending on the kind of the support wafer to be used. The temperature in the step of heat treatment is preferably from 80 to 150° C. in a case where the support wafer is a sapphire wafer; preferably from 80 to 125° C. in a case where the support wafer is a silicon wafer or a silicon wafer with an oxide film; and preferably from 80 to 110° C. in a case where the support wafer is a glass wafer. The heat treatment time at the above temperature is not particularly limited, and may be from 10 minutes to 125 hours. For example, the heat treatment time is preferably from 10 minutes to 125 hours when the heat treatment temperature is 80° C. or higher and lower than 110° C., the heat treatment time is preferably from 10 minutes to 48 hours when the heat treatment temperature is 110° C. or higher and lower than 125° C., and the heat treatment time is preferably from 10 minutes to 36 hours when the heat treatment temperature is 125° C. or higher and lower than 150° C. Examples of a heat treatment apparatus include, but not particularly limited to, a heat treatment furnace and oven. As the temperature of the laminate, an atmospheric temperature in the furnace or oven measured with, for example, a thermocouple placed therein may be used. The heat treatment of the laminate provided with the protection wafer for long hours at a temperature as low as 80° C. or higher improves a bonding force at the lamination interface between the support wafer and the oxide single-crystal wafer and at the same time, facilitates embrittlement of the ion-implanted layer for splitting.

The resulting composite wafer having an oxide single-crystal film on the support wafer is preferably cooled to a temperature in the vicinity of room temperature (including room temperature), for example, from 10 to 50° C. For example, the composite wafer may be cooled to a desired temperature by allowing it to stand in a room adjusted to 25° C. For example, the composite wafer obtained by heat-treating the laminate having a protection wafer fixed on the support wafer-side surface of the laminate is preferably cooled and then subjected to removal of the protection wafer. A method of removing the protection wafer is not particularly limited, and may be removed physically or chemically. For example, when the protection wafer is fixed through a double sided tape, both the protection wafer and the double sided tape may be removed from the composite wafer by inserting a cutter between the protection wafer and the composite wafer. For example, when the protection wafer is fixed using an adhesive, the protection wafer may be removed from the composite wafer by immersing a portion of the composite wafer extending from the protection wafer to the surface of the composite wafer having the protection wafer thereon in a solvent such as toluene to dissolve the adhesive therein.

By using the above-described method, a composite wafer comprising a support wafer, and an oxide single-crystal film, which is a lithium tantalate or lithium niobate film, on the support wafer can be obtained. The thickness of the oxide single-crystal film of the resulting composite wafer corresponds to the implantation depth of hydrogen ions during the hydrogen ion implantation and is preferably from 100 to 1000 nm. The surface of the oxide single-crystal film may be optionally ground.

According to the invention, the method of producing a composite wafer is not particularly limited, and one of the embodiments is shown in FIG. 1. Hydrogen ions 12 are implanted into an oxide single-crystal wafer 11 through a surface thereof to form an ion-implanted layer 13 inside the oxide single-crystal wafer 11 (in step a). The surface 11s of the oxide single-crystal wafer 11 from which the ions have been implanted and the surface 14s of a support wafer 14 to be laminated with the oxide single-crystal wafer are both subjected to surface activation treatment by exposing them to an ion beam 15 (in step b). After the surface activation treatment, the surface 11s of the oxide single-crystal wafer from which the ions have been implanted is bonded to the surface 14s of the support wafer to obtain a laminate 16 (in step c). A protection wafer 20 is provided on a surface 16s of the resulting laminate 16 on the oxide single-crystal wafer side (in step d). The laminate 16 having the protection wafer 20 thereon was heat-treated at a temperature of 80° C. or higher to embrittle the ion-implanted layer 13 and split the oxide single-crystal wafer along the embrittled ion-implanted layer 13b, so that a portion 11b of the oxide single-crystal wafer is removed and a composite wafer 18 having an oxide single-crystal film 11a transferred onto the support wafer 14 can be obtained (in step e). Although not shown, in the step d, the laminate may be provided with the protection wafer on the support wafer-side surface thereof, or the laminate may be provided with the protection wafer on both the oxide single-crystal wafer-side surface and the support wafer-side surface thereof.

EXAMPLES

Example 1

A sapphire wafer having a diameter of 100 mm and a thickness of 0.35 mm was used as the support wafer, while a lithium tantalate wafer having a diameter of 100 mm and a thickness of 0.35 mm was used as the oxide single-crystal wafer. Each of the surface of the sapphire wafer and the surface of the lithium tantalate wafer to be bonded (i.e. laminated) together had a surface roughness RMS of 1.0 nm or less.

First, an ion-implanted layer was formed inside the lithium tantalate wafer by implanting hydrogen atom ions from the surface of the lithium tantalate wafer to the depth of 650 nm under the following conditions: an implantation dose of $8.0 \times 10^{16}$ atom/cm$^2$ and an accelerating voltage of 100 KeV. Next, the surface of the lithium tantalate wafer from which the ions had been implanted and the surface of the sapphire wafer to be laminated with the lithium tantalate wafer were activated by vacuum ion beam treatment with a vacuum ion beam apparatus under $7 \times 10^{-6}$ Pa, while using Ar as an ion source. Next, the activated surfaces of the sapphire wafer and the lithium tantalate wafer were bonded (i.e. laminated) together at room temperature (25° C.) to obtain each laminate. Next, as a protection wafer, a silicon wafer having a diameter of 100 mm and a thickness of 0.35 mm was fixed through a double sided tape on each of the sapphire wafer-side surface and the lithium tantalate wafer-side surface of the laminates. Then, each laminate provided with the protection wafers was heated to a temperature of 80, 90, 100, 110, 125, or 150° C., and heat-treatment at the temperature for 48 hours to split the laminate along the ion-implanted layer to obtain each composite wafer having a lithium tantalate film transferred onto the sapphire wafer. A heat treatment oven was used as a heater, and the atmospheric temperature in the oven was measured as the temperature of each laminate by using a thermocouple. Each composite wafer thus obtained was allowed to stand until the temperature decreased to room temperature. Then, the protection wafers were removed from each composite wafer by using a toluene solution. The result of the appearance inspection of each composite wafer thus obtained is shown in Table 1. The appearance inspection was performed visually. A composite wafer having a film transferred onto the entire surface of the support wafer was evaluated as "A", a composite wafer having a film partially transferred onto the surface of the support wafer was evaluated as "B", and a composite wafer not formed due to failure of film transfer or a composite wafer having a crack in the film was evaluated as "F".

Comparative Example 1

A composite wafer was obtained in the same manner ad in Example 1 except that the laminate was heat-treated at 70° C. for 48 hours. The result of the appearance inspection of the composite wafer thus obtained is shown in Table 1.

Comparative Example 2

A composite wafer was obtained in the same manner as in Example 1 except that the laminate was heat-treated at 175° C. for 48 hours. The result of the appearance inspection of the composite wafer thus obtained is shown in Table 1.

Example 2

Each composite wafer was obtained in the same manner ad in Example 1 except that the a silicon wafer having a diameter of 100 mm and a thickness of 0.35 mm was used as the support wafer, each laminate was heated to a temperature of 80, 90, 100, 110, or 125° C., and heat-treated at the temperature for 48 hours. Each of the surface of the silicon wafer and the surface of the lithium tantalate wafer to be bonded together had a surface roughness RMS of 1.0 nm or less. The result of the appearance inspection of each composite wafer thus obtained is shown in Table 1.

Comparative Example 3

A composite wafer was obtained in the same manner as in Example 2 except that the laminate was heat-treated at 70° C. for 48 hours. The result of the appearance inspection of the composite wafer thus obtained is shown in Table 1.

Comparative Example 4

A composite wafer was obtained in the same manner as in Example 2 except that the laminate was heat-treated at 150° C. for 48 hours. The result of the appearance inspection of the composite wafer thus obtained is shown in Table 1.

Example 3

Each composite wafer was obtained in the same manner as in Example 1 except that a silicon-wafer-with-an-oxide film containing a silicon wafer having a diameter of 100 mm and a thickness of 0.35 mm and a 100-nm oxide film on the silicon wafer was used as the support wafer, and each laminate was heated to a temperature of 80, 90, 100, 110, or 125° C., and heat-treated at the temperature for 48 hours. Each of the surface of the silicon wafer with an oxide film and the surface of the lithium tantalate wafer to be bonded together had a surface roughness RMS of 1.0 nm or less. The result of the appearance inspection of each composite wafer thus obtained is shown in Table 1. The silicon wafer with an oxide film described above was obtained by heating a silicon wafer at 1100° C. for about one hour in advance to grow a 100-nm thermal oxide film thereon.

Comparative Example 5

A composite wafer was obtained in the same manner in Example 3 except that the laminate was heat-treated at 70° C. for 48 hours. The result of the appearance inspection of the composite wafer thus obtained is shown in Table 1.

Comparative Example 6

A composite wafer was obtained in the same manner as in Example 3 except that the laminate was heat-treated at 150° C. for 48 hours. The result of the appearance inspection of the composite wafer thus obtained is shown in Table 1.

Example 4

Each composite wafer was obtained in the same manner as in Example 1 except that a glass wafer having a diameter of 100 mm and a thickness of 0.35 mm was used as the support wafer, and each laminate was heated to a temperature of 80, 90, 100, or 110° C., and heat-treated at the temperature for 48 hours. Each of the surface of the glass wafer and the surface of the lithium tantalate wafer to be bonded together had a surface roughness RMS of 1.0 nm or less. The result of the appearance inspection of the composite wafer thus obtained is shown in Table 1.

Comparative Example 7

A composite wafer was obtained in the same manner as in Example 4 except that each laminate was heat-treated at 70° C. for 48 hours. The result of the appearance inspection of the composite wafer thus obtained is shown in Table 1.

Comparative Example 8

A composite wafer was obtained in the same manner as in Example 4 except that the laminate was heat-treated at 125° C. for 48 hours. The result of the appearance inspection of the composite wafer thus obtained is shown in Table 1.

TABLE 1

| kind of support wafer | temperature (° C.) of laminate during heat treatment | | | | | | | |
|---|---|---|---|---|---|---|---|---|
| | 70 | 80 | 90 | 100 | 110 | 125 | 150 | 175 |
| sapphire (Example 1 and Comp. Exs. 1-2) | F | A | A | A | A | A | A | F |
| silicon (Example 2 and Comp. Exs. 3-4) | F | A | A | A | A | A | F | — |
| silicon with oxide film (Example 3 and Comp. Exs. 5-6) | F | A | A | A | A | A | F | — |
| glass (Example 4 and Comp. Exs. 7-8) | F | A | A | A | A | F | — | — |

Regarding the composite wafer samples obtained using a sapphire wafer as the support wafer and the heat treatment at 80 to 150° C., the composite wafer samples obtained using a silicon wafer as the support wafer and the heat treatment at 80 to 125° C., the composite wafer samples obtained using a silicon wafer with an oxide film as the support wafer and the heat treatment at 80 to 125° C., and the composite wafer samples obtained using a glass wafer as the support wafer and the heat treatment at 80 to 110° C., it is confirmed that each lithium tantalate film was transferred onto the entire surface of each support wafer as shown in Table 1.

In any of the support wafers, when the heat treatment temperature was 70° C., there was no split along the ion-implanted layer but peeling occurred at the interface between the two wafers laminated together. Regarding the composite wafer sample obtained using a sapphire wafer as the support wafer and the heat treatment at 175° C., the composite wafer sample obtained using a silicon wafer or a silicon wafer with an oxide film as the support wafer and the heat treatment at 150° C., and the composite wafer sample obtained using a glass wafer as the support wafer and the heat treatment at 125° C., each oxide single-crystal wafer was broken into pieces at the lamination interface between the support wafer and the oxide single-crystal wafer so that the film was not transferred.

When experiments were carried out in the same manner as in Examples 1 to 4 except that a lithium niobate wafer was used as the oxide single-crystal wafer, the same results as those shown in Table 2 were obtained. When experiments were carried out in the same manner as in Examples 1 to 4 except that ozone water treatment, UV ozone treatment, or plasma treatment was used instead of the vacuum ion beam treatment as the surface activation treatment, exactly the same results were obtained. Further, when experiments were carried out in the same manner as in Examples 1 to 4 except that the protection wafer was fixed with an adhesive, exactly the same results were obtained so that it is presumed that the fixing method of the protection wafer has no particular influence on the results.

Example 5

Each composite wafer was obtained in the same manner as in Example 1 except for use of a glass wafer having a diameter of 100 mm and a thickness of 0.35 mm as the protection wafer. The result of the appearance inspection of each composite wafers thus obtained is shown in Table 2.

Comparative Example 9

A composite wafer was obtained in the same manner as in Example 5 except that the laminate was heat-treated at 70° C. for 48 hours. The result of the appearance inspection of the composite wafer thus obtained is shown in Table 2.

Comparative Example 10

A composite wafer was obtained in the same manner as in Example 5 except that the laminate was heat-treated at 175° C. for 48 hours. The result of the appearance inspection of the composite wafer thus obtained is shown in Table 2.

Example 6

A composite wafer was obtained in the same manner as in Example 2 except for use of a glass wafer having a diameter of 100 mm and a thickness of 0.35 mm as the protection wafer. The result of the appearance inspection of the composite wafer thus obtained is shown in Table 2.

Comparative Example 11

A composite wafer was obtained in the same manner as in Example 6 except that the laminate was heat-treated at 70°

C. for 48 hours. The result of the appearance inspection of the composite wafer thus obtained is shown in Table 2.

Comparative Example 12

A composite wafer was obtained in the same manner as in Example 6 except that the laminate was heat-treated at 150° C. for 48 hours. The result of the appearance inspection of the composite wafer thus obtained is shown in Table 2.

Example 7

Each composite wafer was obtained in the same manner as in Example 3 except for use of a glass after having a diameter of 100 mm and a thickness of 0.35 mm as the protection wafer. The result of the appearance inspection of each composite wafers thus obtained is shown in Table 2.

Comparative Example 13

A composite wafer was obtained in the same manner as in Example 7 except that the laminate was heat-treated at 70° C. for 48 hours. The result of the appearance inspection of the composite wafer thus obtained is shown in Table 2.

Comparative Example 14

A composite wafer was obtained in the same manner as in Example 7 except that the laminate was heat-treated at 150° C. for 48 hours. The result of the appearance inspection of the composite wafer thus obtained is shown in Table 2.

Example 8

Each composite wafer was obtained in the same manner as in Example 4 except for use of a glass wafer having a diameter of 100 mm and a thickness of 0.35 mm as the protection wafer. The result of the appearance inspection of the composite wafer thus obtained is shown in Table 2.

Comparative Example 15

A composite wafer was obtained in the same manner as in Example 8 except that the laminate was heat-treated at 70° C. for 48 hours. The result of the appearance inspection of the composite wafer thus obtained is shown in Table 2.

Comparative Example 16

A composite wafer was obtained in the same manner as in Example 8 except that the laminate was heat-treated at 125° C. for 48 hours. The result of the appearance inspection of the composite wafer thus obtained is shown in Table 2.

TABLE 2

| kind of support wafer | temperature (° C.) of laminate during heat treatment | | | | | | | |
|---|---|---|---|---|---|---|---|---|
| | 70 | 80 | 90 | 100 | 110 | 125 | 150 | 175 |
| sapphire (Example 5 and Comp. Exs. 9-10) | F | A | A | A | A | A | A | F |
| silicon (Example 6 and Comp. Exs. 11-12) | F | A | A | A | A | A | F | — |
| silicon with oxide film (Example 7 and Comp. Exs. 13-14) | F | A | A | A | A | A | F | — |
| glass (Example 8 and Comp. Exs. 15-16) | F | A | A | A | A | F | — | — |

Regarding the composite wafer samples obtained using a sapphire wafer as the support wafer and the heat treatment at 80 to 150° C., the composite wafer samples obtained using a silicon wafer as the support wafer and the heat treatment at 80 to 125° C., the composite wafer samples obtained using a silicon wafer with an oxide film as the support wafer and the heat treatment at 80 to 125° C., and the composite wafer samples obtained using a glass wafer as the support wafer and the heat treatment at 80 to 110° C., it is confirmed that each lithium tantalate film was transferred onto the entire surface of each support wafer as shown in Table 2.

In any of the support wafers, when the heat treatment temperature was 70° C., there was no split along the ion-implanted layer and peeling occurred at the interface between the two wafers laminated together. Regarding the sample obtained using a sapphire wafer as the support wafer and the heat treatment at 175° C., the sample obtained using a silicon wafer or a silicon wafer with an oxide film as the support wafer and the heat treatment at 150° C., and the sample obtained using a glass wafer as the support wafer and the heat treatment at 125° C., the oxide single-crystal wafer was broken into pieces at the lamination interface between the support wafer and the oxide single-crystal wafer so that the film was not transferred.

When experiments were carried out in the same manner as in Examples 5 to 8 except that a lithium niobate wafer was used as the oxide single-crystal wafer, the same results as those shown in Table 2 were obtained. When experiments were carried out in the same manner as in Examples 5 to 8 except that ozone water treatment, UV ozone treatment, or plasma treatment was used instead of the vacuum ion beam treatment as the surface activation treatment, exactly the same results were obtained. Further, when experiments were carried out in the same manner as in Examples 5 to 8 except that the protection wafer was fixed with an adhesive, exactly the same results were obtained so that it is presumed that the fixing method of the protection wafer has no particular influence on the results.

Example 9

Each composite wafer was obtained in the same manner as in Example 1 except that hydrogen atom ions were implanted into the depth of 650 nm from the surface of each lithium tantalate wafer under the following conditions: an implantation dose of $5.0\times10^{16}$, $7.5\times10^{16}$, $10\times10^{16}$, $12.5\times10^{16}$, $15\times10^{16}$, $17.5\times10^{16}$, $20\times10^{16}$, $22.5\times10^{16}$, $25\times10^{16}$, or $27.5\times10^{16}$ atom/cm$^2$ and an accelerating voltage of 100 KeV to form an ion-implanted layer inside the lithium tantalate wafer, and each laminate provided with the protection wafer was heat-treated at 110° C. for 48 hours.

Comparative Example 17

A composite wafer was obtained in the same manner as in Example 9 except that hydrogen atom ions were implanted from the surface of the lithium tantalate wafer under the following conditions: an implantation dose of $4.0 \times 10^{16}$ atom/cm$^2$ and an accelerating voltage of 100 KeV to form an ion-implanted layer inside the lithium tantalate wafer.

Referential Example 1

A lithium tantalate wafer having a diameter of 100 mm and a thickness of 0.35 mm was used as the oxide single-crystal wafer. The surface of the lithium tantalate wafer to be laminated had a surface roughness RMS of 1.0 nm or less. The hydrogen atom ions were implanted from the surface of the lithium tantalate wafer into the depth of 650 nm under the following conditions: an implantation dose of $30 \times 10^{16}$ atom/cm$^2$ and an accelerating voltage of 100 KeV to form an implanted layer inside the lithium tantalate wafer. As a result, unevenness was observed on the surface of the lithium tantalate wafer before lamination. Since the lithium tantalate wafer did not have a desired surface roughness for the lamination, it was not laminated. The unevenness on the surface of the lithium tantalate wafer is presumed to occur because the implanted hydrogen failed to become dissolved and foamed inside the wafer.

Example 10

Each composite wafer was obtained in the same manner as ion Example 2 except that hydrogen atom ions were implanted from the surface of each lithium tantalate wafer into the depth of 650 nm under the following conditions: an implantation dose of $5.0 \times 10^{16}$, $7.5 \times 10^{16}$, $10 \times 10^{16}$, $12.5 \times 10^{16}$, $15 \times 10^{16}$, $17.5 \times 10^{16}$, $20 \times 10^{16}$, $22.5 \times 10^{16}$, $25 \times 10^{16}$, and $27.5 \times 10^{16}$ atom/cm$^2$ and an accelerating voltage of 100 KeV to form an ion-implanted layer inside the lithium tantalate wafer, and each laminate provided with the protection wafer was heat-treated at 110° C. for 48 hours.

Comparative Example 18

A composite wafer was obtained in the same manner as in Example 10 except that the hydrogen atom ions were implanted from the surface of the lithium tantalate wafer under the following conditions: an implantation dose of $4.0 \times 10^{16}$ atom/cm$^2$ and an accelerating voltage of 100 KeV to form an ion-implanted layer inside the lithium tantalate wafer.

Example 11

Each composite wafer was obtained in the same manner as in Example 3 except that the hydrogen atom ions were implanted from the surface of each lithium tantalate wafer into the depth of 650 nm under the following conditions: an implantation dose of $5.0 \times 10^{16}$, $7.5 \times 10^{16}$, $10 \times 10^{16}$, $12.5 \times 10^{16}$, $15 \times 10^{16}$, $17.5 \times 10^{16}$, $20 \times 10^{16}$, $22.5 \times 10^{16}$, $25 \times 10^{16}$, and $27.5 \times 10^{16}$ atom/cm$^2$ and an accelerating voltage of 100 KeV to form an ion-implanted layer inside the lithium tantalate wafer, and each laminate provided with the protection wafers was heat-treated at 110° C. for 48 hours.

Comparative Example 19

A composite wafer was obtained in the same manner as in Example 11 except that the hydrogen atom ions were implanted from the surface of the lithium tantalate wafer under the following conditions: an implantation dose of $4.0 \times 10^{16}$ atom/cm$^2$ and an accelerating voltage of 100 KeV to form an ion-implanted layer inside the lithium tantalate wafer.

Example 12

Each composite wafer was obtained in the same manner as in Example 4 except that the hydrogen atom ions were implanted from the surface of each lithium tantalate wafer into the depth of 650 nm under the following conditions: an implantation dose of $5.0 \times 10^{16}$, $7.5 \times 10^{16}$, $10 \times 10^{16}$, $12.5 \times 10^{16}$, $15 \times 10^{16}$, $17.5 \times 10^{16}$, $20 \times 10^{16}$, $22.5 \times 10^{16}$, $25 \times 10^{16}$, and $27.5 \times 10^{16}$ atom/cm$^2$ and an accelerating voltage of 100 KeV to form an ion-implanted layer inside the lithium tantalate wafer, and each laminate provided with the protection wafers was heat-treated at 110° C. for 48 hours.

Comparative Example 20

A composite wafer was obtained in the same manner as in Example 12 except that the hydrogen atom ions were implanted from the surface of the lithium tantalate wafer under the following conditions: an implantation dose of $4.0 \times 10^{16}$ atom/cm$^2$ and an accelerating voltage of 100 KeV to form an ion-implanted layer inside the lithium tantalate wafer.

It is confirmed that in Examples 9 to 12 in which the hydrogen atom ions were implanted at implantation doses of from $5.0 \times 10^{16}$ to $27.5 \times 10^{16}$ atom/cm$^2$, each lithium tantalate film was transferred onto the entire surface of each support wafer irrespective of the kind of the support wafer. On the other hand, in Comparative Examples 17 to 20 in which the hydrogen atom ions were implanted at each implantation dose of $4.0 \times 10^{16}$ atom/cm$^2$, no split occurred at the ion-implanted layer of the lithium tantalate wafer irrespective of the kind of the support wafer. This is presumed to occur because the ion implantation dose was not sufficient and embrittlement was not achieved in a later step.

Although the hydrogen atom ions were used in Examples 9 to 12, the same results could be obtained even by using hydrogen molecule ions at a half of the implantation dose of hydrogen atom ions. In addition, the same results as those of Examples 9 to 12 could be obtained by using a lithium niobate wafer as the oxide single-crystal wafer.

Example 13

Ten lithium tantalate wafers and ten sapphire wafers were provided, and ten composite wafers were obtained in the same manner as in Example 1 except that the hydrogen atom ions were implanted from the surface of each lithium tantalate wafer into the depth of 650 nm under the following conditions: an implantation dose of $9.0 \times 10^{16}$ atom/cm$^2$ and an accelerating voltage of 100 KeV to form an ion-implanted layer inside each lithium tantalate wafer, and each laminate provided with a silicon wafer serving as a protection wafer on each of the sapphire wafer-side surface and the lithium tantalate wafer-side surface thereof was heat-treated at 110° C. for 48 hours. As a yield, a ratio (%) of the number of the composite wafers that succeeded in transfer of a lithium tantalate film onto the entire surface of each sapphire wafer to the number (i.e. ten) of the composite wafers thus obtained is shown in Table 3.

Example 14

Ten composite wafers were obtained in the same manner as in Example 13 except that each laminate was provided with a protection wafer only on the lithium tantalate wafer-side surface thereof. The yield of the composite wafers thus obtained is shown in Table 3.

Example 15

Ten composite wafers were obtained in the same manner as in Example 13 except that each laminate was provided with a protection wafer only on the sapphire wafer-side surface thereof. The yield of the composite wafers thus obtained is shown in Table 3.

Comparative Example 21

Ten composite wafers were obtained in the same manner as in Example 13 except that the laminate was heat-treated without a protection wafer. The yield of the composite wafer thus obtained is shown in Tables 3, 4, and 5.

Example 16

Ten lithium tantalate wafers and ten silicon wafers were provided, and ten composite wafers were obtained in the same manner in Example 2 except that the hydrogen atom ions were implanted from the surface of each lithium tantalate wafer into the depth of 650 nm under the following conditions: an implantation dose of $9.0 \times 10^{16}$ atom/cm$^2$ and an accelerating voltage of 100 KeV to form an ion-implanted layer inside each lithium tantalate wafer, and each laminate provided with a silicon wafer serving as a protection wafer on each of the silicon wafer-side surface and the lithium tantalate wafer-side surface thereof was heat-treated at 110° C. for 48 hours. As a yield, a ratio (%) of the number of the composite wafers that succeeded in transfer of a lithium tantalate film onto the entire surface of each silicon wafer to the number (i.e. ten) of the composite wafers thus obtained is shown in Table 3.

Example 17

Ten composite wafers were obtained in the same manner as in Example 16 except that each laminate was provided with a protection wafer only on the lithium tantalate wafer-side surface thereof. The yield of the composite wafers thus obtained is shown in Table 3.

Example 18

Ten composite wafers were obtained in the same manner as in Example 16 except that each laminate was provided with a protection wafer only on the silicon wafer-side surface thereof. The yield of the composite wafers thus obtained is shown in Table 3.

Comparative Example 22

Ten composite wafers was obtained in the same manner as in Example 16 except that each laminate was heat-treated without a protection wafer. The yield of the composite wafer thus obtained is shown in Tables 3, 4, and 5.

Example 19

Ten lithium tantalate wafers and ten silicon wafers with an oxide film were provided, and ten composite wafers were obtained in the same manlier as in Example 3 except that the hydrogen atom ions were implanted from the surface of each lithium tantalate wafer into the depth of 650 nm under the following conditions: an implantation dose of $9.0 \times 10^{16}$ atom/cm$^2$ and an accelerating voltage of 100 KeV to form an ion-implanted layer inside each lithium tantalate wafer, and each laminate provided with a silicon wafer serving as a protection wafer on each of the surface of the silicon-wafer-with-an-oxide-film side and the surface of the lithium tantalate wafer side thereof was heat-treated at 110° C. for 48 hours. As a yield, a ratio (%) of the number of the composite wafers that succeeded in transfer of a lithium tantalate film onto the entire surface of each silicon wafer with an oxide film to the number (i.e. ten) of the composite wafers thus obtained is shown in Table 3.

Example 20

Ten composite wafers were obtained in the same manner as in Example 19 except that each laminate was provided with a protection wafer only on the lithium tantalate-side surface thereof. The yield of the composite wafers thus obtained is shown in Table 3.

Example 21

Ten composite wafers were obtained in the same manner as in Example 19 except that each laminate was provided with the protection wafer only on the surface of the silicon-wafer-with-an-oxide-film side thereof. The yield of the composite wafers thus obtained is shown in Table 3.

Comparative Example 23

Ten composite wafers were obtained in the same manner as in Example 19 except that each laminate was heat-treated without a protection wafer. The yield of the composite wafers thus obtained is shown in Tables 3, 4, and 5.

Example 22

Ten lithium tantalate wafers and ten glass wafers were provided, and ten composite wafers were obtained in the same manner as in Example 4 except that the hydrogen atom ions were implanted from the surface of each lithium tantalate wafer into the depth of 650 nm under the following conditions: an implantation dose of $9.0 \times 10^{16}$ atom/cm$^2$ and an accelerating voltage of 100 KeV to form an ion-implanted layer inside each lithium tantalate wafer, and each laminate provided with a silicon wafer serving as a protection wafer on each of the glass wafer-side surface and the lithium tantalate wafer-side surface thereof was heat-treated at 110° C. for 48 hours. As a yield, a ratio (%) of the number of the composite wafers that succeeded in transfer of a lithium tantalate film onto the entire surface of each glass wafer to the number (i.e. ten) of the composite wafers thus obtained is shown in Table 3.

Example 23

Ten composite wafers were obtained in the same manner as in Example 22 except that each laminate was provided with the protection wafer only on the lithium tantalate-side surface thereof. The yield of the composite wafers thus obtained is shown in Table 3.

Example 24

Ten composite wafers were obtained in the same manner as in Example 22 except that each laminate was provided with a protection wafer only on the glass wafer-side surface thereof. The yield of the composite wafers thus obtained is shown in Table 3.

Comparative Example 24

Ten composite wafers were obtained in the same manner as in Example 22 except that each laminate was heat-treated without a protection wafer. The yield of the composite wafer thus obtained is shown in Tables 3, 4, and 5.

TABLE 3

| | yield (%) of composite wafers laminate surface which protection wafer was placed during heat treatment | | | |
|---|---|---|---|---|
| kind of support wafer | both surfaces | lithium tantalate wafer-side surface | support wafer-side surface | no protection wafer |
| sapphire (Examples 13-15 and Comp. Ex. 21) | 100 | 90 | 80 | 10 |
| silicon (Exampls 16-18 and Comp. Ex. 22) | 100 | 100 | 80 | 10 |
| silicon with oxide film (Examples 19-21 and Comp. Ex. 23) | 100 | 100 | 80 | 10 |
| glass (Examples 22-24 and Comp. Ex. 24) | 100 | 90 | 70 | 0 |

As shown Table 3, the laminates provided with a protection wafer on both sides thereof are superior in the yield of transfer of the film onto the entire surface of each support wafer to the laminates provided with a protection wafer on one side thereof. In the case of the laminates provided with a protection wafer on one side thereof, the laminates provided with the protection wafer on the tantalum lithium wafer side are superior in the yield of transfer of the film to the entire surface of each support wafer to the laminates provided with the protection wafer on the support wafer side. This is presumed to occur because lithium tantalate is a hard and fragile material so that the protection wafer produces a marked effect when provided on this material. Further, it is confirmed that even the laminates having the protection wafer only on the support wafer side have a considerably improved yield compared with the laminates having no protection wafer. When experiments were carried out in the same manner as in Examples 13 to 24 except that a lithium niobate wafer was used as the oxide single-crystal wafer, the same results as those shown in Table 3 were obtained. When experiments were carried out in the same manner as in Examples 13 to 24 except that ozone water treatment, UV ozone treatment, or plasma treatment was carried out in place of the vacuum ion beam treatment as the surface activation treatment, the exactly the same results were obtained.

Example 25

Ten lithium tantalate wafers and ten sapphire wafers were provided, and ten composite wafers were obtained in the same manner as in Example 5 except that the hydrogen atom ions were implanted from the surface of each lithium tantalate wafer into the depth of 650 nm under the following conditions: an implantation dose of $9.0\times10^{16}$ atom/cm$^2$ and an accelerating voltage of 100 KeV to form an ion-implanted layer inside each lithium tantalate wafer, and each laminate provided with a glass wafer serving as a protection wafer on each of the sapphire wafer-side surface and the lithium tantalate wafer-side surface thereof was heat-treated at 110° C. for 48 hours. As a yield, a ratio (%) of the number of the composite wafers that succeeded in transfer of a lithium tantalate film onto the entire surface of each sapphire wafer to the number (i.e. ten) of the composite wafers thus obtained is shown in Table 4.

Example 26

Ten composite wafers were obtained in the same manner as in Example 25 except that each laminate was provided with the protection wafer only on the lithium tantalate-side surface thereof. The yield of the composite wafers thus obtained is shown in Table 4.

Example 27

Ten composite wafers were obtained in the same manner as in Example 25 except that each laminate was provided with the protection wafer only on the sapphire wafer-side surface thereof. The yield of the composite wafers thus obtained is shown in Table 4.

Example 28

Ten lithium tantalate wafers and ten silicon wafers were provided, and ten composite wafers were obtained in the same manner as in Example 6 except that the hydrogen atom ions were implanted from the surface of each lithium tantalate wafer into the depth of 650 nm under the following conditions: an implantation dose of $9.0\times10^{16}$ atom/cm$^2$ and an accelerating voltage of 100 KeV to form an ion-implanted layer inside each lithium tantalate wafer, and each laminate provided with a glass wafer serving as a protection wafer on each of the silicon wafer-side surface and the lithium tantalate wafer-side surface thereof was heat-treated at 110° C. for 48 hours. As a yield, a ratio (%) of the number of the composite wafers that succeeded in transfer of a lithium tantalate film onto the entire surface of each silicon wafer to the number (i.e. ten) of the composite wafers thus obtained is shown in Table 4.

Example 29

Ten composite wafers were obtained in the same manner as in Example 28 except that each laminate was provided with the protection wafer only on the lithium tantalate-side surface thereof. The yield of the composite wafers thus obtained is shown in Table 4.

Example 30

Ten composite wafers were obtained in the same manner as in Example 28 except that each laminate was provided with the protection wafer only on the silicon wafer-side surface thereof. The yield of the composite wafers thus obtained is shown in Table 4.

Example 31

Ten lithium tantalate wafers and ten silicon wafers with an oxide film were provided, and ten composite wafers were obtained in the same manner as in Example 7 except that the hydrogen atom ions were implanted from the surface of each lithium tantalate wafer into the depth of 650 nm under the following conditions: an implantation dose of $9.0\times10^{16}$ atom/cm$^2$ and an accelerating voltage of 100 KeV to form an ion-implanted layer inside each lithium tantalate wafer, and each laminate provided with a glass wafer serving as a protection wafer on each of the silicon-wafer-with-an-oxide-film-side surface and the lithium tantalate wafer-side surface was heat-treated at 110° C. for 48 hours. As a yield, a ratio (%) of the number of the composite wafers that succeeded in transfer of a lithium tantalate film onto the entire surface of each silicon wafer with an oxide film to the number (i.e. ten) of the composite wafers thus obtained is shown in Table 4.

Example 32

Ten composite wafers were obtained in the same manner as in Example 31 except that each laminate was provided with the protection wafer only on the lithium tantalate side surface thereof. The yield of the composite wafers thus obtained is shown in Table 4.

Example 33

Ten composite wafers were obtained in the same manner as in Example 31 except that each laminate was provided with the protection wafer only on the silicon-wafer-with-an-oxide-film-side surface thereof. The yield of the composite wafers thus obtained is shown in Table 4.

Example 34

Ten lithium tantalate wafers and ten glass wafers were provided, and ten composite wafers were obtained in the same manner as in Example 8 except that the hydrogen atom ions were implanted from the surface of each lithium tantalate wafer into the depth of 650 nm under the following conditions: an implantation dose of $9.0\times10^{16}$ atom/cm$^2$ and an accelerating voltage of 100 KeV to form an ion-implanted layer inside each lithium tantalate wafer, and each laminate provided with a glass wafer serving as a protection wafer on each of the glass wafer-side surface and the lithium tantalate wafer-side surface thereof was heat-treated at 110° C. for 48 hours. As a yield, a ratio (%) of the number of the composite wafers that succeeded in transfer of a lithium tantalate film onto the entire surface of each glass wafer to the number (i.e. ten) of the composite wafers thus obtained is shown in Table 4.

Example 35

Ten composite wafers were obtained in the same manner as in Example 34 except that each laminate was provided with the protection wafer only on the lithium tantalate wafer-side surface thereof. The yield of the composite wafers thus obtained is shown in Table 4.

Example 36

Ten composite wafers were obtained in the same manner as in Example 34 except that each laminate was provided with the protection wafer only on the glass wafer-side surface thereof. The yield of the composite wafers thus obtained is shown in Table 4.

TABLE 4

| | yield (%) of composite wafers laminate surface which protection wafer was placed during heat treatment | | | |
|---|---|---|---|---|
| kind of support wafer | both surfaces | lithium tantalate wafer-side surface | support wafer-side surface | no protection wafer |
| sapphire (Examples 25-27 and Comp.Ex. 21) | 100 | 70 | 60 | 10 |
| silicon (Exampls 28-30 and Comp.Ex. 22) | 100 | 70 | 60 | 10 |
| silicon with oxide film (Examples 31-33 and Comp.Ex. 23) | 100 | 70 | 60 | 10 |
| glass (Examples 34-36 and Comp.Ex. 24) | 100 | 80 | 50 | 0 |

As shown in Table 4, the laminates provided with a protection wafer on both sides thereof are superior in the yield of transfer of the film to the entire surface of each support wafer to the laminates provided with a protection wafer on one side thereof. In the case of the laminates provided with a protection wafer on one side thereof, the laminates provided with the protection wafer on the tantalum lithium wafer side are superior in the yield of transfer of the film to the entire surface of each support wafer to the laminates provided with the protection wafer on the support wafer side. This is presumed to occur because lithium tantalate is a hard and fragile material so that the protection wafer produces a marked effect when provided on this material. Further, it is confirmed that even the laminates having the protection wafer only on the support wafer side have a considerably improved yield compared with the laminates having no protection wafer. When experiments were carried out in the same manner as in Examples 25 to 36 except that a lithium niobate wafer was used as the oxide single-crystal wafer, the same results as those shown in Table 4 were obtained. When experiments were carried out in the same manner as in Examples 25 to 36 except that ozone water treatment, UV ozone treatment, or plasma treatment was carried out in place of the vacuum ion beam treatment as the surface activation treatment, exactly the same results were obtained.

Example 37

Ten composite wafers were obtained in the same manner as in Example 13 except that a sapphire wafer having a diameter of 100 mm and a thickness of 0.35 mm was used as the protection wafer, and was fixed to each of the sapphire wafer-side surface and the lithium tantalate wafer-side surface of each laminate through a double sided tape. As a yield, a ratio (%) of the number of the composite wafers that succeeded in transfer of a lithium tantalate film onto the entire surface of each sapphire wafers to the number (i.e. ten) of the composite wafers thus obtained is shown in Table 5.

Example 38

Ten composite wafers were obtained in the same manner as in Example 37 except that each laminate was provided with the protection wafer only on the lithium tantalate wafer-side surface thereof. The yield of the composite wafers thus obtained is shown in Table 5.

Example 39

Ten composite wafers were obtained in the same manner as in Example 37 except that each laminate was provided with the protection wafer only on the lithium tantalate wafer-side surface thereof. The yield of the composite wafers thus obtained is shown in Table 5.

Example 40

Ten composite wafers were obtained in the same manner as in Example 16 except that a sapphire wafer having a diameter of 100 mm and a thickness of 0.35 mm was used as the protection wafer, and was fixed to each of the silicon wafer-side surface and the lithium tantalate wafer-side surface of each laminate through a double sided tape. As a yield, a ratio (%) of the number of the composite wafers that succeeded in transfer of a lithium tantalate film onto the entire surface of each silicon wafer to the number (i.e. ten) of the composite wafers thus obtained is shown in Table 5 as a yield.

Example 41

Ten composite wafers were obtained in the same manner as in Example 40 except that each laminate was provided with the protection wafer only on the lithium tantalate wafer-side surface thereof. The yield of the composite wafers thus obtained is shown in Table 5.

Example 42

Ten composite wafers were obtained in the same manner as in Example 40 except that each laminate was provided with the protection wafer only on the silicon wafer-side surface thereof. The yield of the composite wafers thus obtained is shown in Table 5.

Example 43

Ten composite wafers were obtained in the same manner as in Example 19 except that a sapphire wafer having a diameter of 100 mm and a thickness of 0.35 mm was used as the protection wafer, and was fixed to each of the silicon-wafer-with-an-oxide-film-side surface and the lithium tantalate wafer-side surface of each laminate through a double sided tape. As a yield, a ratio (%) of the number of the composite wafers that succeeded in transfer of a lithium tantalate film onto the entire surface of each silicon wafer with an oxide film to the number (i.e. ten) of the composite wafers thus obtained is shown in Table 5.

Example 44

Ten composite wafers were obtained in the same manner as in Example 43 except that each laminate was provided with the protection wafer only on the lithium tantalate wafer-side surface thereof. The yield of the composite wafers thus obtained is shown in Table 5.

Example 45

Ten composite wafers were obtained in the same manner as in Example 43 except that each laminate was provided with the protection wafer only on the silicon-wafer-with-an-oxide-film-side surface thereof. The yield of the composite wafers thus obtained is shown in Table 5.

Example 46

Ten composite wafers were obtained in the same manner as in Example 22 except that a sapphire wafer having a diameter of 100 mm and a thickness of 0.35 mm was used as the protection wafer, and was fixed to each of the glass wafer-side surface and the lithium tantalate wafer-side surface of each laminate through a double sided tape. As a yield, a ratio (%) of the number of the composite wafers that succeeded in transfer of a lithium tantalate film onto the entire surface of each glass wafer to the number (i.e. ten) of the composite wafers thus obtained is shown in Table 5 as a yield.

Example 47

Ten composite wafers were obtained in the same manner as in Example 46 except that each laminate was provided with the protection wafer only on the lithium tantalate wafer-side surface thereof. The yield of the composite wafers thus obtained is shown in Table 5.

Example 48

Ten composite wafers were obtained in the same manner as in Example 46 except that each laminate was provided with the protection wafer only on the glass wafer-side surface thereof. The yield of the composite wafers thus obtained is shown in Table 5.

TABLE 5

| | yield (%) of composite wafers laminate surface which protection wafer was placed during heat treatment | | | |
|---|---|---|---|---|
| kind of support wafer | both surfaces | lithium tantalate wafer-side surface | support wafer-side surface | no protection wafer |
| Sapphire (Examples 37-39 and Comp. Ex. 21) | 100 | 100 | 90 | 10 |
| Silicon (Exampls 40-42 and Comp. Ex. 22) | 100 | 100 | 100 | 10 |
| silicon with oxide film (Examples 43-45 and Comp. Ex. 23) | 100 | 100 | 100 | 10 |
| Glass (Examples 46-48 and Comp. Ex. 24) | 100 | 100 | 90 | 0 |

As shown Table 5, the laminates provided with a protection wafer on both sides thereof are superior in the yield of transfer of the film onto the entire surface of each support wafer to the laminates provided with a protection wafer on one side thereof. In the case of the laminates provided with a protection wafer on one side thereof, the laminates provided with a protection wafer on the tantalum lithium wafer side are superior in the yield of transfer of the film onto the entire surface of each support wafer to the laminates provided with a protection film on the support wafer side. This is presumed to occur because lithium tantalate is a hard and fragile material so that the protection wafer produces a marked effect when provided on this material. Further, it is confirmed that even the laminates having the protection wafer only on the support wafer side have a considerably improved yield compared with the laminates having no protection wafer. When experiments were carried out in the same manner as in Examples 37 to 48 except that a lithium niobate wafer was used as the oxide single-crystal wafer, the same results as those shown in Table 5 were obtained. When experiments were carried out in the same manner as in Examples 37 to 48 except that ozone water treatment, UV ozone treatment, or plasma treatment was carried out in place of the vacuum ion beam treatment as the surface activation treatment, exactly the results as those shown in Table 5 were obtained.

EXPLANATION OF SYMBOLS

11: oxide single-crystal wafer
11s: surface of oxide single-crystal wafer
11a: oxide single-crystal film
11b: a portion of oxide single-crystal wafer after split
12: hydrogen ion
13: ion-implanted layer
13b: ion-implanted layer after embrittlement
14: support wafer
14s: surface of support wafer
15: ion beam for exposition
16s: oxide single-crystal wafer-side surface of laminate
18: composite wafer
20: protection wafer

The invention claimed is:

1. A method of producing a composite wafer having an oxide single-crystal film on a support wafer, the method comprising steps of:
    implanting hydrogen atom ions or hydrogen molecule ions into an oxide single-crystal wafer through a surface thereof, which wafer is a lithium tantalate or lithium niobate wafer, to form an ion-implanted layer inside the oxide single-crystal wafer;
    subjecting at least one of the surface of the oxide single-crystal wafer and a surface of a support wafer to be laminated with the oxide single-crystal wafer to surface activation treatment;
    after the surface activation treatment, bonding the surface of the oxide single-crystal wafer to the surface of the support wafer to obtain a laminate;
    providing at least one of surfaces of the laminate with a protection wafer having a thermal expansion coefficient smaller than that of the oxide single-crystal wafer; and
    heat-treating the laminate provided with the protection wafer at a temperature of 80° C. or higher to split the laminate along the ion-implanted layer to obtain an oxide single-crystal film transferred onto the support wafer,
    wherein an implantation dose of the hydrogen atom ions is from $5.0 \times 10^{16}$ atom/cm$^2$ to $2.75 \times 10^{17}$ atom/cm$^2$ and an implantation dose of the hydrogen molecule ions is from $2.5 \times 10^{16}$ atoms/cm$^2$ to $1.37 \times 10^{17}$ atoms/cm$^2$,
    the support wafer is selected from the group consisting of a sapphire wafer, a silicon wafer, a silicon wafer with an oxide film, and a glass wafer, and
    the temperature of 80° C. or higher in the step of heat-treating is from 80 to 150° C. in a case where the support wafer is the sapphire wafer, from 80 to 125° C. in a case where the support wafer is the silicon wafer or a silicon wafer with an oxide film, and from 80 to 110° C. in a case where the support wafer is the glass wafer.

2. The method of producing a composite wafer according to claim 1, wherein the protection wafer is fixed through a double sided tape or an adhesive.

3. The method of producing a composite wafer according to claim 2, wherein the surface activation treatment is selected from the group consisting of ozone water treatment, UV ozone treatment, ion beam treatment, and plasma treatment.

4. The method of producing a composite wafer according to claim 3, wherein the protection wafer is selected from the group consisting of a sapphire wafer, a silicon wafer, and a glass wafer.

5. The method of producing a composite wafer according to claim 2, wherein the protection wafer is selected from the group consisting of a sapphire wafer, a silicon wafer, and a glass wafer.

6. The method of producing a composite wafer according to claim 1, wherein the surface activation treatment is selected from the group consisting of ozone water treatment, UV ozone treatment, ion beam treatment, and plasma treatment.

7. The method of producing a composite wafer according to claim 6, wherein the protection wafer is selected from the group consisting of a sapphire wafer, a silicon wafer, and a glass wafer.

8. The method of producing a composite wafer according to claim 1, wherein the protection wafer is selected from the group consisting of a sapphire wafer, a silicon wafer, and a glass wafer.

* * * * *